(12) United States Patent
Morf et al.

(10) Patent No.: US 8,552,386 B2
(45) Date of Patent: Oct. 8, 2013

(54) IMAGE ACQUISITION DEVICES WITH CONTRAST AND SPATIAL RESOLUTION ENHANCED BACK-SCATTER SHIELDING

(75) Inventors: Daniel Morf, Buch am Irchel (CH); Viktor Steinlin, Otelfingen/ZH (CH); Harald Mikula, Wettingen/AG (CH)

(73) Assignee: Varian Medical Systems International AG (CH)

( * ) Notice: Subject to any disclaimer, the term of this patent is extended or adjusted under 35 U.S.C. 154(b) by 5 days.

(21) Appl. No.: 13/156,288

(22) Filed: Jun. 8, 2011

(65) Prior Publication Data

US 2012/0312995 A1    Dec. 13, 2012

(51) Int. Cl.
*G01T 1/20*    (2006.01)
(52) U.S. Cl.
USPC ................................... 250/363.01

(58) Field of Classification Search
USPC ..................................... 250/370.09
See application file for complete search history.

(56) References Cited

U.S. PATENT DOCUMENTS 5,686,733 A * 11/1997 Fallone et al. ............... 250/591
2011/0133096 A1 * 6/2011 Konkle et al. ............ 250/370.09
2012/0168633 A1 * 7/2012 Tredwell .................. 250/370.08

* cited by examiner

*Primary Examiner* — Marcus Taningco
(74) *Attorney, Agent, or Firm* — Houst Consulting

(57) ABSTRACT

An image acquisition device employs a low-Z material to maximize the probability of backscattering or direct hits in Compton scattering for radiation with a given energy spectrum that passes through a detector array to enhance the contrast and spatial resolution of the image acquisition device. A radiation apparatus including the image acquisition device is also provided.

24 Claims, 4 Drawing Sheets

IMAGE ACQUISITION DEVICES WITH CONTRAST AND SPATIAL RESOLUTION
ENHANCED BACK-SCATTER SHIELDING

BACKGROUND

This disclosure relates generally to radiation systems and methods and in particular to image acquisition devices including contrast and spatial resolution enhanced back-scatter shielding.

Various imaging systems including computed tomography (CT), single photon emission computed tomography (SPECT), positron emission tomography (PET), magnetic resonance imaging (MRI), and ultrasound imaging etc. are known and used in acquisition of images. In each imaging system, some kind of detector is used to detect electromagnetic radiation passing through a body of interest. For instance, an X-ray image acquisition system may employ a solid state detector having a detector array including a large number of detector elements or pixels. The detector elements produce image data signals which can be collected, stored, processed, and displayed as digital images. The images acquired may provide detailed information on the structures inside the body of interest, which may be useful e.g. in treatment planning, monitoring, medical diagnosis, security inspection, and in other applications.

It is known that in a radiotherapy system, an image acquisition device may be used in conjunction with a radiation source that produces high energy radiation such as X-rays at Megavolt (MV) energy levels to acquire images. Conventionally, images acquired using radiation at MV energy levels have relatively low contrast as compared to those acquired using radiation of kilo-volt (keV) energy levels since most of MV radiation passes through the image acquisition device without contribution to image signals. The spatial resolution of the acquired images may also be relatively low due to the scattering effect of high energy radiation.

Accordingly, there is a need for image acquisition devices that can be used in conjunction with various radiation sources producing radiation at various energy levels. There is a need for image acquisition devices that can provide images with enhanced contrast and spatial resolution.

SUMMARY

Image acquisition devices including a contrast and spatial resolution enhanced back-scatter shielding are provided. Radiation apparatuses including the image acquisition devices are also provided. Other embodiments are described further herein.

BRIEF DESCRIPTION OF THE DRAWINGS

These and various other features and advantages will become better understood upon reading of the following detailed description in conjunction with the accompanying drawings and the appended claims provided below, where:

DETAILED DESCRIPTION OF EMBODIMENTS

Various embodiments of radiation apparatuses and methods are described. It is to be understood that the invention is not limited to the particular embodiments described as such which may, of course, vary. An aspect described in conjunction with a particular embodiment is not necessarily limited to that embodiment and may be practiced in any other embodiments. For instance, while various embodiments are described in connection with X-ray radiotherapy machines, it will be appreciated that the invention can also be practiced in other radiation apparatuses and modalities. It is also to be understood that the terminology used herein is for the purpose of describing particular embodiments only, and is not intended to be limiting since the scope of the invention will be defined by the appended claims, along with the full scope of equivalents to which such claims are entitled. In addition, various embodiments are described with reference to figures. It should be noted that the figures are intended to facilitate the description of specific embodiments and they are not intended as an exhaustive description or as a limitation on the scope of the invention.

Various relative terms such as "upper," "above," "top," "over," "on," "below," "under," "bottom," "higher," "lower" or similar terms may be used herein for convenience in describing relative positions, directions, or spatial relationships in conjunction with the drawings. The use of the relative terms should not be construed as to imply a necessary positioning, orientation, or direction of the structures or portions thereof in manufacturing or use, and to limit the scope of the invention. As used in the description and appended claims, the singular forms of "a," "an," and "the" include plural references unless the context clearly dictates otherwise. For example, a low-Z material may reference one or more materials or a combination of low-Z materials.

Figure 1:
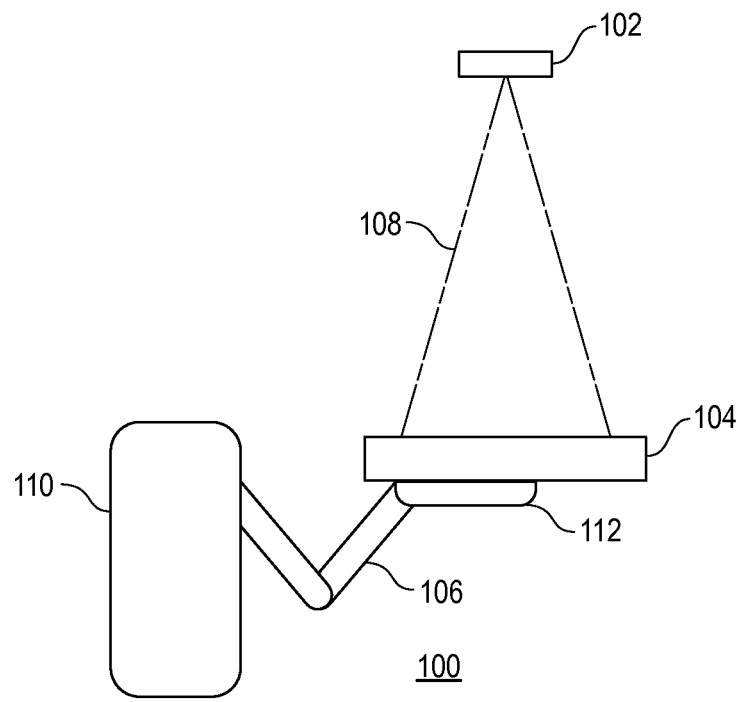
FIG. 1 is a schematic representation of an exemplary radiation apparatus in accordance some embodiments of the disclosure.

FIG. 1 is a schematic representation of an exemplary radiation apparatus 100 which can embody the principle of the disclosure. The radiation apparatus 100 includes a radiation source 102, an image acquisition device 104, and a support structure 106 adapted to position the image acquisition device 104 relative to the radiation source 102. Radiation 108 from the source 102 passes through a body (not shown) and is received by the image acquisition device 104. The image acquisition device 104 may generate and detect image data signals which are indicative of the structure of the body. The image data signals may be processed using a suitable algorithm known in the art and the processed images may be displayed on a display. Alternatively the received signal can be converted into a dose equivalent signal.

The radiation source 102 may be supported by a gantry, C-arm or other suitable structure, and may move or rotate relative to the body being irradiated. For example, the radiation source 102 may be an accelerator or X-ray source enclosed in a rotatable gantry. The radiation source 102 may also be an X-ray tube or accelerator supported by a C-arm or robotic arm which may be movable in various degrees of freedom. The radiation source 102 may be configured to produce radiations at any suitable energy levels. For example, the radiation source 102 may produce radiations at megavolt (MV) energy levels or at kilovolt (keV) energy levels. The radiation source 102 may include a signal beam generator which is capable of generating radiations at multiple energy levels. The radiation source 102 may also include two or more generators, e.g. one for generating radiations at an MV level and one for generating radiations at a keV level. In general, a radiation source 102 includes a target which is adapted to produce radiation beams upon impingement by e.g. energetic electrons. Generation of radiation beams is known in the art and its detail description is omitted herein for clarity of description of this disclosure. In some embodiments, provided is an image acquisition device that is particularly useful in conjunction with a radiation source that is adapted to produce radiations at MV energy levels such as 1-25 MV. It will be appreciated however that the provided image acquisition devices can be used in conjunction with any radiation sources. Various collimation systems may be used to shape and/or size the beam 108 produced by the radiation source 102.

Figure 2:
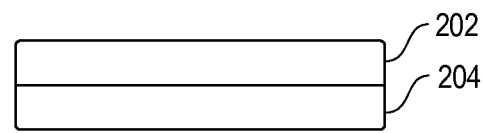
FIG. 2 is a schematic representation of an exemplary image acquisition device in accordance with some embodiments of the disclosure.

FIG. 2 is a schematic representation of an image acquisition device 200 according to some embodiments. The image acquisition device 200 may include a radiation conversion layer 202 and a detector array 204 coupled to the conversion layer 202. In some embodiments, the conversion layer 202 may include scintillators such as cadmium tungstate (CdWO$_4$) and bismuth germanate (Bi$_4$Ge$_3$O$_{12}$ or BGO), cesium iodide (CsI), Gadolinium oxisulfide (Gd$_2$O$_2$S:Tb), etc., which may be configured to generate visible light photons in response to X-ray radiation. A detector array 204 may be coupled to the scintillators and configured to generate electrical signals in response to the light photons generated by the scintillators. In some embodiments, the conversion layer 202 may include photoconductors such as mercuric iodide (HgI$_2$), lead iodide (PbI$_2$), bismuth iodide (BiI$_3$), cadmium zinc telluride (CdZnTe), amorphous selenium (a-Se), etc., which may be configured to generate electron-hole pairs or charges in response to X-ray radiation. A detector array 204 may be coupled to the photoconductors and configured to generate electrical signals in response to the electron-hole charges generated by the photoconductors. Various other detection schemes are possible and can be used in embodying the principle of the disclosure.

Figure 3:
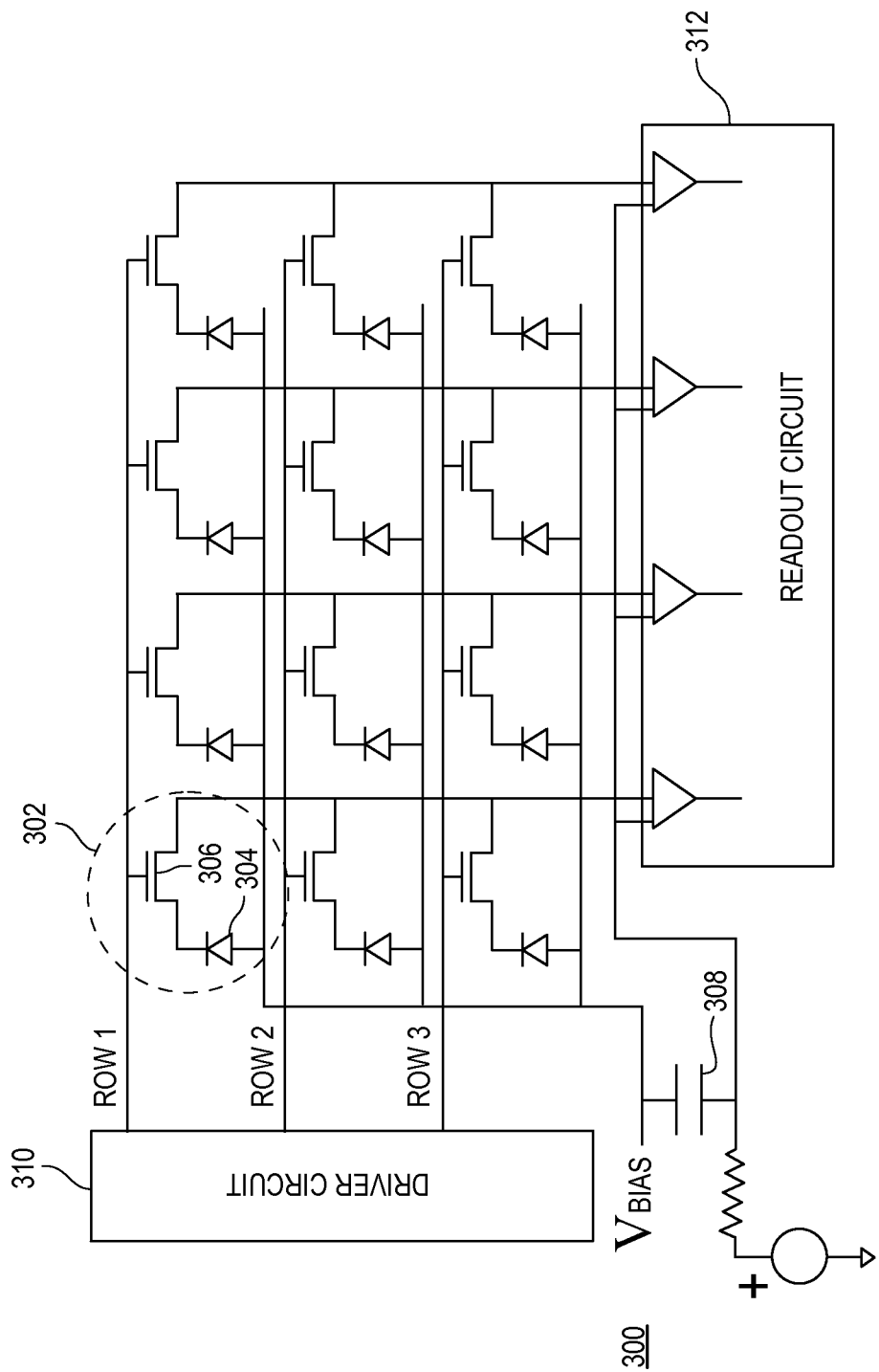
FIG. 3 is a schematic representation of an exemplary detection array in accordance with some embodiments of the disclosure.

FIG. 3 is a schematic representation of an exemplary detector array 300 which can embody the principle of the disclosure. The detector array 300 may include a large number e.g. hundreds of thousands or millions of detector elements or pixels 302 arranged in rows and columns or other patterns forming an active detection area. For clarity of description of the embodiments, three rows and four columns of detector elements are shown and it will be appreciated that the disclosure is so limited. By way of example, each pixel 302 in a detector array 300 may include a storage capacitor 304 such as a photodiode and a switching element 306 such as a thin film transistor (TFT). The storage capacitor 304 may be biased by a biasing voltage 308 to establish a capacitance for storing electrical charges which accumulate due to the reception of incident light or electron-hole pairs from the conversion layer. When it is desired to capture image data from a pixel, a control signal from an array driver circuit 310 drives the gate of the switching element e.g. TFT, and the electrical signal from the storage capacitor is readout by a readout circuit assembly 312. In acquisition of image data, each row address signal from the array driver circuit 310 can be asserted for a predetermined period of time or "line time."

During assertion of each row address signal, the signal from each pixel along that row can be transmitted via column data lines to the readout circuit assembly 312 where the signal on each data line can be received and buffered by a corresponding charge sensitive amplifier. Hence, an entire row of image data can be captured in one line time period. With each subsequent line time period, a subsequent row of image data can be captured. At the end of a "frame time" period, the entire image can be captured. In this manner, each pixel contained in the entire active detection area can be sampled individually. The image data signals can be converted by analog-to digital converters (ADCs), and the resulting digitized image data signals can be then multiplexed, buffered, and transmitted to a control and processing system for further processing. It will be appreciated that other detection and acquisition schemes are possible and can be used in embodying the principle of the disclosure.

Returning to FIG. 1, the support structure 106 can be any suitable structure adapted to position the image acquisition device 104 relative to the radiation source 102. In general, it can be any object placed underneath the detector. By way of example, the support structure 106 may include a robotic arm having one or more pivotal sections that may facilitate positioning of the image acquisition device 104. In some embodiments, the robotic arm 106 may be supported by a stand 110 which operates as a fixed support structure. In some embodiments, the robotic arm 106 may operate to extend the image acquisition device 104 from and retract it into a gantry, which may be rotatably coupled to a fixed stand. As such, a gantry may operate to support both the radiation source 102 and the image acquisition device 104 via a robotic arm 106.

Figure 4:
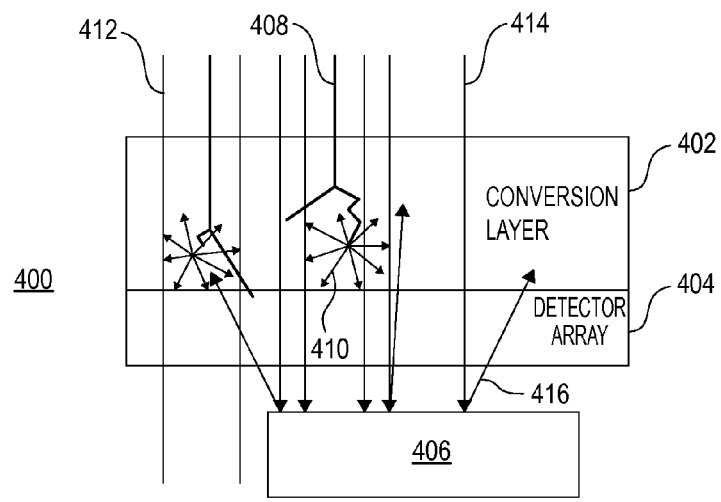
FIG. 4 is a schematic representation of an image acquisition device and a supporting arm showing the effects of back-scattering on image acquisition.

The support structure 106 may include a mounting fixture 112 underneath the image acquisition device 104. The mounting fixture 112 may include steel, copper, or other metal or non-metal parts, which may provide for rigid support for the image acquisition device 104. One issue associated with the mounting fixture 112 or the support structure 106 is that it may scatter radiation that has passed through the image acquisition device 104. The scattered radiation may go back into the image acquisition device 104 and create unwanted signals. FIG. 4 schematically illustrates some effects of scattered radiation on an image acquisition device 400. As shown, the image acquisition device 400 may include a radiation conversion layer 402 and a detector array 404, and may be supported by a support structure 406. In use, some incident radiation 408 may interact e.g. with scintillators in the conversion layer 402, during which visible light photons 410 are generated. The generated visible light photons 410 may be captured by the underneath detector elements and contribute to image signals. Some incident radiation 412 may not interact with the scintillators when passing through the conversion layer 402, and thus no visible light photons are generated. As such, the radiation may simply pass through the image acquisition device 400 and do not contribute to image signals. Some incident radiation 414 may pass through the conversion layer 402 and detection array 404, hit the underneath supporting structure 406, and scatter. The scattered radiation 416 may enter into the conversion layer 402 and interact with e.g. scintillators to generate visible light photons, which may be captured by the underneath detector array 404. However, since the scattered radiation 416 may enter into the conversion layer 402 at angles of non-180 degree with respect to their incident radiation direction, the visible light photons which may be generated by the scattered radiation 416 may be captured by neighboring detector elements that are adjacent to the detector elements in alignment with the incident radiation direction. Therefore, the signals generated by the scattered radiation 416 may cause blurring of the image and reduce the spatial resolution of the image acquisition device 400.

In conventional image acquisition devices for use with sources providing radiation of MV energy levels, only about two percent of the radiation may interact with a conversion layer to generate visible light photons or electrical charges and be captured. Most of the high energy radiation may simply pass through the image acquisition device and do not contribute to image signals. Furthermore, the support structure underneath the image acquisition device may scatter a significant portion of the radiation, which may enter back into the imager, creating unwanted signals. In addition, if the support structure is attached to only a portion of the image acquisition device from underneath, then problems in gain and offset correction of raw images may arise.

Figure 5:
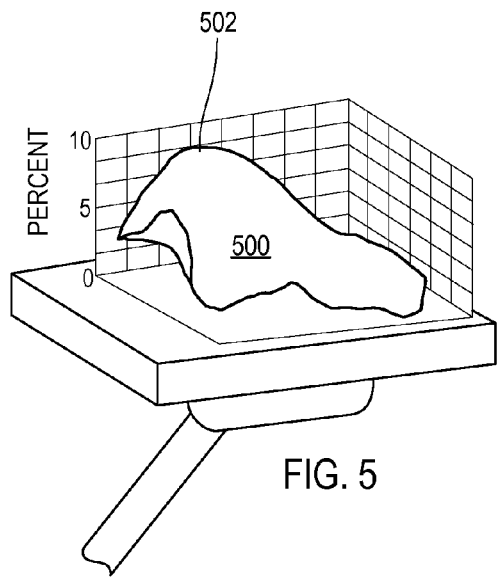
FIG. 5 shows an image signal graph of uncorrected image data acquired by an image acquisition device supported by a support arm.

FIG. 5 schematically shows an uncorrected image 500 with increased image signals 502 caused by scattered radiation. A gain and offset correction is generally applied on the acquired image data to correct for variations in the detector array such as pixel dark current, pixel sensitivity, and back-scattering effects etc. It is known that in the absence of X-rays, each pixel or detector element may have certain amount of leakage or dark current associated with it. Finite gray scale value may result from image acquisition in the absence of X-rays, depending on the dark current value in each individual detector element. The dark current values are different from pixel to pixel, and vary with acquisition time. Offset correction corrects for the variation in dark current on a pixel-by-pixel basis. On the other hand, on exposure of X-rays, each pixel or detector element may have a subtly different response due to different sensitivity and non-uniformities in gain profiles of the amplifiers or in exposure profile etc. Scattering by the support structure underneath the detector array may increase signal intensity and appear as a higher gain. Gain correction corrects for the difference in gain between detector elements. The gain and offset values used for gain and offset correction can be obtained prior to the operation of the image acquisition device using a suitable technique. For example, an offset value can be obtained by acquiring a series of dark images in the absence of X-rays exposure and averaging together. A gain value can be obtained by acquiring a series of gain images using homogeneous X-ray exposure and averaging together. The gain and offset values may be stored and applied to raw image data to perform gain and offset correction. In general an offset and gain correction involves subtraction of an offset value from original uncorrected pixel and multiplying the result by a gain correction factor.

Figure 6:
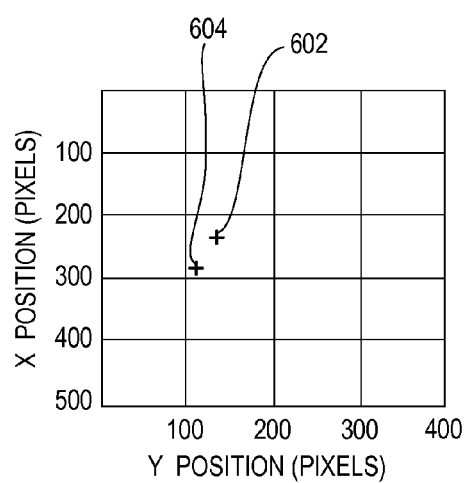
FIG. 6 is an image signal graph showing signal gains due to back-scattering by a supporting arm.

Scattering by the support structure increases gain but it is possible that the gain does not come from the same spatial location as it manifests due to different scatter angles. As illustrated in FIG. 6, the increase in signal at detector location 602, which manifests itself as an increased gain, could come from detector location 604. In situations where the size of the radiation field is reduced e.g. for treating small target volume such that only a part of the imager is covered, the gain correction for location 602 may be overdone because location 604 which could have caused scattered radiation may not be irradiated anymore since the field size is reduced. Therefore, the calibration may fail and image quality may degrade. This may particularly be a problem when the imager is used for a 2D dose measurement.

Accordingly, in some embodiments of the disclosure, a layer or plate of a high-Z material may be provided between the detector array and the supporting structure. The high-Z material may be chosen and/or the thickness of the high-Z material may be selected such that the radiation passing through the image acquisition device may be absorbed by the high-Z material and do not even reach the underneath supporting structure. Alternatively, the high-Z material may be chosen and/or the thickness of the high-Z material may be selected such that even if a portion of the radiation may pass through the high-Z material and scatter from the underneath supporting structure, the scattered radiation can be absorbed by the high-Z material and thus prevent it from entering into the image acquisition device.

In some alternative embodiments, a layer or plate of a low-Z material may be provided adjacent to the detector array. The low-Z material may increase the probability of Compton scattering and hence "direct hits" such that the scattered radiation may enter into the image acquisition device at substantially 180 degrees with respect to the incident radiation direction. While it is not intended to limit the embodiments to a particular theory, it is believed that Compton scattering occurs when an incident photon interacts with an outer-shell electron in an atom, removes the electron from its shell, and then proceeds in a different direction as a scattered photon. A direct hit refers to an event where a scattered photon is deflected back in a direction substantially opposite to the incident photon. As used herein the scattered photon in a direct hit may be referred to as backscatter photon. A Compton backscatter photon possesses less energy than the incident photon, typically in keV range. In general an image acquisition device is much more efficient when the photons detected are in the keV range. The backscatter radiation from the low-Z material may interact with the scintillators or photoconductors in the conversion layer to generate visible light photons or electrical charges. The generated visible light photons or electrical charges may be captured by the underneath detector elements that are in alignment with the incident radiation direction. As a result, the contrast and efficiency of the image acquisition device can be improved since additional photons, rather than being wasted, backscatter from the low-Z material and contribute to the image acquisition.

In some embodiments, both a layer of a low-Z material and a layer of high-Z material may be provided between the image acquisition device and the underneath supporting structure. The layer of the low-Z material may be positioned adjacent to the detector array and the layer of the high-Z material may be positioned adjacent to the support structure. The layer of the low-Z material may increase the probability of producing direct hits in Compton scattering such that the backscatter radiation may enter into the image acquisition device at substantially 180 degree. The layer of the high-Z material may absorb radiation that scatters from the underneath support structure at various angles, thus preventing scattered radiation that could reach a different pixel than the pixel through which the original x-ray came, from entering into the image acquisition device. Alternatively, the layer of the high-Z material may be chosen and/or the thickness of the high-Z material may be selected such that the radiation that passes through the image acquisition device may be absorbed by the high-Z material before even reaching the underneath supporting structure. The use of both a low-Z and a high-Z material may greatly improve the contrast and spatial resolution of the image acquisition device.

As used herein the term "low-Z material" refers to an element or alloy or a compound that has a low atomic number such as equal to or smaller than about 35. In some embodiments, the low-Z material used in the disclosure has an atomic number equal to or smaller than about 30. In some embodiments, the low-Z material used in the disclosure has an atomic number equal to or smaller than about 20. Exemplary low-Z materials include but are not limited to copper, aluminum, beryllium, silicon, carbon, titanium, and their alloys or mixtures.

As used herein the term "high-Z material" refers to an element or alloy or a compound that has a high atomic number such as e.g. equal to or greater than about 50. In some embodiments, the high-Z material used in the disclosure has an atomic number equal to or greater than about 70. In some embodiments, the high-Z material used in the disclosure has an atomic number equal to or greater than about 90. Exemplary high-Z materials include but are not limited to lead, tungsten, tantalum, and their alloys or mixtures.

Figure 7:
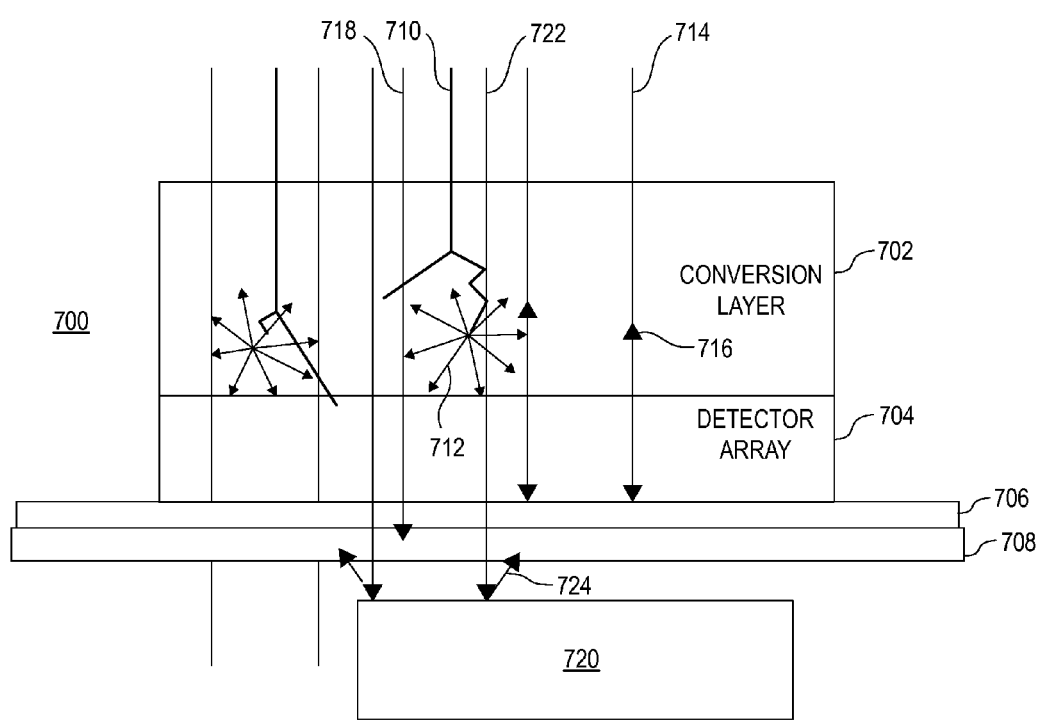
FIG. 7 is a schematic representation of an exemplary image acquisition device in accordance some embodiments of the disclosure.

FIG. 7 is a schematic representation of an exemplary image acquisition device 700 that can embody the principle of the disclosure. As shown, the image acquisition device 700 may include a conversion layer 702 and a detector array 704 coupled to the conversion layer 702. A layer of a low-Z material 706 can be disposed adjacent to the detector array 704 to increase the probability of direct hits in Compton scattering for the radiation that passes through the detector array.

The conversion layer 702 may be configured to convert radiation to e.g. visible light photons or electrical charges. For example, the conversion layer 702 may include scintillators configured to generate visible light photons in response to X-ray radiation. Alternatively the conversion layer 702 may include photoconductors that may be configured to generate electron-hole charges in response to X-ray radiation. Other radiation conversion schemes are possible and can be used in the various embodiments of the disclosure. For example, the conversion layer 702 may include a layer of a suitable metal such as copper that may be configured to generate energetic electrons in response to incident radiation. The generated electrons may interact with scintillators to produce visible light photons.

The detector array 704 may be configured to detect the visible light photons or electrical charges produced by the radiation conversion layer 702. The detector array 704 may include a large number of detector elements which define an active detection area. In some embodiments, the detector elements may be an amorphous silicon (a-Si:H) array deposited or formed on a substrate using techniques known in the art. The substrate may be glass, quarts, or plastics etc. Other forms of detector elements such as amorphous alloys of silicon and carbon, crystalline silicon, organic semiconductors etc. are possible and can be used in the various embodiments of the disclosure.

The layer of the low-Z material 706 may be disposed adjacent to the detector array 704. In some embodiments, a plate made of the low-Z material may be disposed under the substrate on which the detector array 704 is deposited to increase the probability of direct hits on the low-Z material by radiation. The layer of the low-Z material 706 may extend an area that is at least equal to or greater than the active detection area of the detector array 704. By way of example, the thickness of the low-Z material layer may range but is not limited to from 0.5 to 3 mm.

In some embodiments, a layer of a high-Z material 708 can be provided. The layer of the high-Z material 708 may be disposed adjacent to the layer of the low-Z material 706. The layer of the high-Z material 708 may extend an area that is at least equal to or greater than the active detection area of the detector array 704. The thickness of the high-Z material layer may range but is not limited to from 1 to 5 mm.

As shown in FIG. 7, when radiation is received by the image acquisition device 700, some radiation 710 may interact e.g. with scintillators in the conversion layer 702 during which visible light photons 712 may be generated. The generated visible light photons 712 may be captured by the underneath detector elements 704 and contribute to image signals. Some incident radiation 714 may pass through the conversion layer 702 and the detector array 704 and hit the layer of low-Z material 706. The low-Z material 706 may facilitate producing direct hits in Compton scattering and the backscatter radiation 716 may enter into the conversion layer 702 at an angle substantially of 180 degree. As used herein substantially 180 degree means that the backscatter radiation with an energy distribution substantially enters into the same detector element or an element in close proximity that the incident radiation has passed through. The backscatter radiation 716 may interact with the scintillators in the conversion layer 702 to generate visible light photons, which may be captured by the underneath detector elements 704 that are in alignment with the incident radiation direction. Some radiation 718 may pass through the layer of the low-Z material 706 and hit the underneath layer of high-Z material 708. The layer of high-Z material 708 may absorb the radiation 718 such that it may not even reach the underneath supporting structure 720. Alternative, if some radiation 722 passes through the layer of high-Z material 708 and hits the underneath support structure 720, causing off-180 degree scattering, the scattered radiation 724 may be absorbed by the layer of the high Z-material 708 so that it may not enter into the conversion layer 702.

An image acquisition device and a radiation apparatus including the image acquisition device have been described. Those skilled in the art will appreciate that various other modifications may be made within the spirit and scope of the invention. All these or other variations and modifications are contemplated by the inventors and within the scope of the invention.

What is claimed is:

1. An image acquisition device, comprising:
   a conversion layer adapted to produce visible light photons or electrical charges in response to radiation at Megavolt energy levels;
   a detector array adapted to detect the produced visible light photons or electrical charges, said detector array comprising a substrate and a plurality of detector elements over the substrate; and
   a layer of a low-Z material behind the substrate to scatter back radiation that passes through the detector array.

2. The image acquisition device of claim 1 wherein the low-Z material comprises an element that has an atomic number equal to or smaller than 30.

3. The image acquisition device of claim 1 wherein the low Z-material is selected from the group consisting of silicon, carbon, beryllium, and titanium.

4. The image acquisition device of claim 1 wherein the detector array comprises a plurality of detector elements defining an active detection area, and the layer of the low-Z material extends an area that is at least equal to or greater than the active detection area.

5. The image acquisition device of claim 1 further comprising a layer of a high-Z material behind the layer of the low-Z material.

6. The image acquisition device of claim 5 wherein the detector array comprises a plurality of detector elements defining an active detection area, and the layer of the high-Z material extends an area that is at least equal to or greater than the active detection area.

7. The image acquisition device of claim 5 wherein the detector array comprises a plurality of detector elements defining an active detection area, and the layer of the high-Z material extends an area that is smaller than the active detection area.

8. The image acquisition device of claim 5 wherein the detector array comprises a plurality of detector elements defining an active detection area, and at least the layer of the low-Z material extends an area that is at least equal to or greater than the active detection area respectively.

9. The image acquisition device of claim 5 wherein the high-Z material comprises an element that has an atomic number equal to or greater than 50.

10. The image acquisition device of claim 1 wherein the conversion layer comprises scintillators adapted to produce visible light photons in response to X-ray radiation.

11. The image acquisition device of claim 1 wherein the low-Z material comprises aluminum.

12. The image acquisition device of claim 1 wherein the low Z-material has a thickness ranging from about 0.5 mm to about 3 mm.

13. An image acquisition device comprising:
a conversion layer comprising photoconductors configured to produce electron-hole charges in response to X-ray radiation;
a detector array configured to detect the produced electron-hole charges; and
a layer of a low-Z material configured to scatter back radiation that passes through the detector array.

14. The image acquisition device of claim 13 wherein the low Z-material is selected from the group consisting of aluminum, silicon, carbon, beryllium, and titanium.

15. A radiation apparatus, comprising:
a radiation source operable to produce radiation at Megavolt energy levels;
an image acquisition device; and
a support structure adapted to position the image acquisition device relative to the radiation source;
wherein the image acquisition device comprises a radiation conversion layer to produce visible light photons or electrical charges in response to radiation at Megavolt energy levels, a detector array to detect the produced visible light photons or electrical charges, and a layer of a low-Z material behind the detector array to scatter back radiation that passes through the detector array.

16. The radiation apparatus of claim 15 wherein the low-Z material comprises an element that has an atomic number equal to or smaller than 30.

17. The radiation apparatus of claim 15 wherein the low Z-material is selected from the group consisting of aluminum, silicon, carbon, beryllium, and titanium.

18. The radiation apparatus of claim 15 wherein the detector array comprises a plurality of detector elements defining an active detection area, and the layer of the low-Z material extends an area that is at least equal to or greater than the active detection area.

19. The radiation apparatus of claim 18 wherein the high-Z material comprises an element that has an atomic number equal to or greater than 50.

20. The radiation apparatus of claim 15 further comprising a layer of a high-Z material between the layer of the low-Z material and the support structure.

21. The image acquisition device of claim 20 wherein the detector array comprises a plurality of detector elements defining an active detection area, and at least the layer of the low-Z material extends an area that is at least equal to or greater than the active detection area respectively.

22. The radiation apparatus of claim 15, wherein the detector array comprises a substrate and a plurality of detector elements over the substrate, and the layer of the low-Z material is disposed behind the substrate.

23. An imaging method, comprising the steps of:
passing x-ray radiation at Megavolt energy levels through a conversion layer comprising a scintillator, thereby a minor portion of the x-ray radiation is converted into visible light and a major portion of the x-ray radiation passes through the conversion layer;
scattering the major portion of the x-ray radiation that passes through the conversion layer using a layer of a low Z-material, thereby additional visible light is generated by x-ray radiation scattered back into the conversion layer;
detecting the visible light and the additional visible light using a detector array.

24. The imaging method of claim 23 wherein the low-Z material is selected from the group consisting of aluminum, silicon, carbon, beryllium, and titanium.

* * * * *